United States Patent [19]
Rao

[11] Patent Number: 5,153,846
[45] Date of Patent: Oct. 6, 1992

[54] DIGITAL SHIFT REGISTER USING RANDOM ACCESS MEMORY

[75] Inventor: Sailesh K. Rao, Lakewood, N.J.

[73] Assignee: AT&T Bell Laboratories, Murray Hill, N.J.

[21] Appl. No.: 559,876

[22] Filed: Jul. 30, 1990

[51] Int. Cl.[5] .............................................. G06F 15/31
[52] U.S. Cl. ................................................ 364/724.16
[58] Field of Search ....................... 364/724.16, 724.01

[56] References Cited

U.S. PATENT DOCUMENTS

| | | | |
|---|---|---|---|
| 3,872,290 | 3/1975 | Crooke et al. | 364/724.12 |
| 4,025,772 | 5/1977 | Constant | 364/724.11 X |
| 4,691,293 | 9/1987 | Conboy | 364/724.16 |
| 4,766,561 | 8/1988 | Thompson et al. | 364/724.13 |
| 4,777,612 | 10/1988 | Tomimitsu | 364/724.13 |
| 4,791,596 | 12/1988 | Harbich | 364/724.16 |
| 5,047,972 | 9/1991 | Wada | 364/724.16 |

Primary Examiner—Tan V. Mai
Attorney, Agent, or Firm—G. D. Green

[57] ABSTRACT

A tapped digital shift register suitable for use with a finite-impulse-response (FIR) filter in applications such as high-definition television is implemented using a random-access memory (RAM). The RAM contains x words having yz bits each, where x represents the number of elements in each section of the shift register, y represents the number of taps and z represents the number of bits in each element. Words are continuously read from and written back into the RAM. Before being written back, each word is modified by removing a z-bit portion from one end and appending a z-bit portion representing new information to the other end. The shift-register architecture disclosed is particularly suited for implementation on very-large-scale integrated circuits together with the FIR filter circuits.

16 Claims, 5 Drawing Sheets

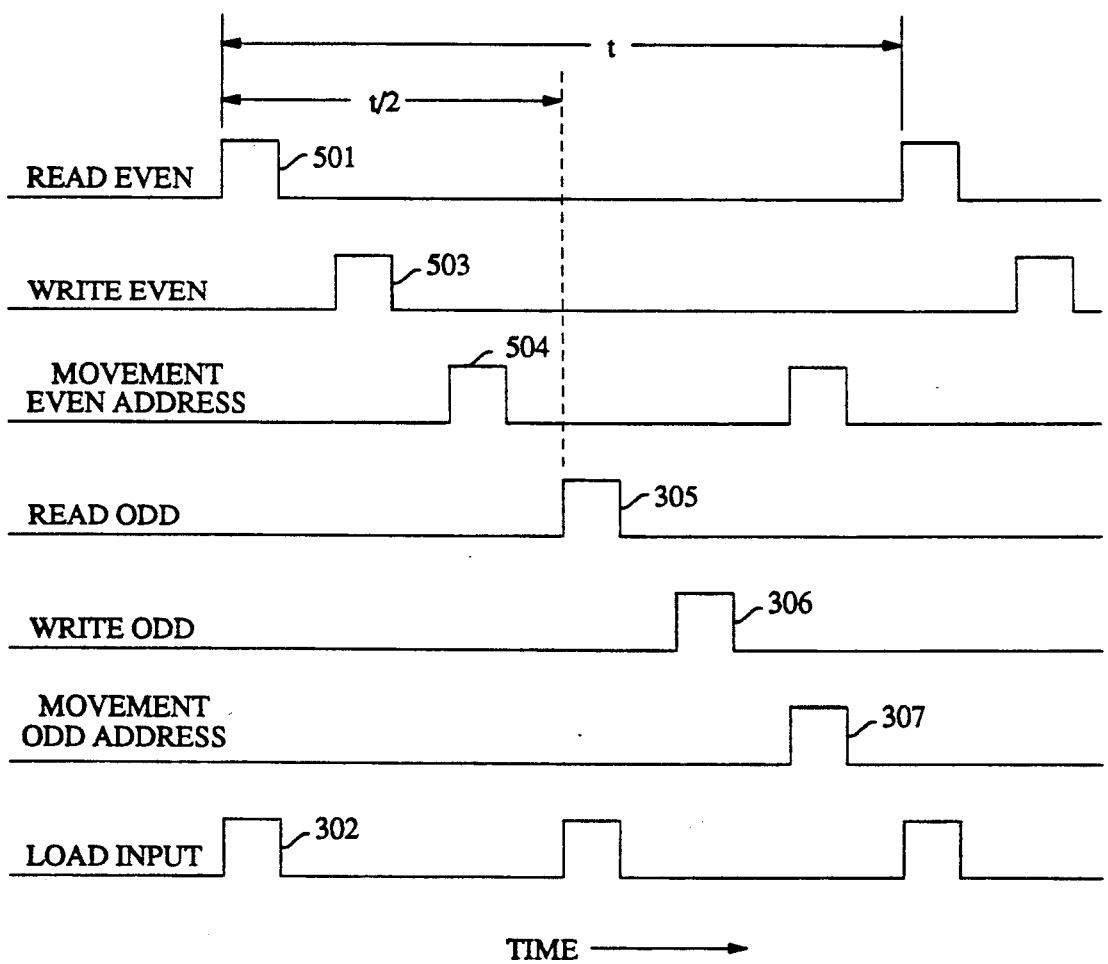

DIGITAL SHIFT REGISTER USING RANDOM ACCESS MEMORY

BACKGROUND OF THE INVENTION

This invention relates to shift registers for use with digital signals; more particularly, to tapped digital shift registers for sue with finite-impulse-response (FIR) filters.

FIR filters have various uses in digital signal processing applications, such as in preparing high-definition television (HDTV) signals for transmission over channels with limited bandwidth. A television picture is a succession of frames, each of which can be represented as a set of picture elements (pixels). Each pixel can be digitally encoded to represent it brightness. To avoid transmitting the digital representation of each pixel for each frame, which would be impractical within the limited bandwidth of VHF and UHF television channels, various encoding schemes are possible that take advantage of redundancy in video signals. FIR filters are useful in such schemes. In one such encoding scheme described in patent application Ser. No. 07/495,523, filed Mar. 19, 1990 now U.S. Pat. No. 5,063,444, one set of FIR filters generates signals representing horizontal characteristics of the television picture and another set of FIR filters generates signals representing vertical characteristics. Representative examples of prior-art FIR filters are shown in U.S. Pat. Nos. 3,872,290 and 4,691,293.

Because a video signal consists of a series of horizontal scan lines and each scan line can be represented as a series of digitally encoded pixels, sequential digitally-encoded pixels can be readily stored and applied together to the taps of the horizontal FIR filters. However, the pixels in a vertical line of a television picture appear in successive scan lines (assuming no interlacing), so a way must be devised by which the pixels in a vertical line can be applied together to the taps of the vertical FIR filters. One such way is to insert delay lines such as digital shift registers between the taps of the vertical FIR filters so that the digitally encoded pixels in a vertical line are presented together at the taps.

Digital shift registers can be implemented in random-access memory (RAM) and used in association with FIR filters. See, for example, U.S. Pat. Nos. 4,766,561 and 4,777,612. However, the FIR filters disclosed in such patents are used in applications where the kinds of delays needed for video signals as described above are not needed. Accordingly, it is an object of this invention to develop an architecture for digital shift registers that can be used advantageously with a FIR filter in video applications.

With the advent of very-large-scale integrated circuit (VLSI) technology, it has become possible to fabricate large numbers of high-speed digital circuits, such as the digital circuits in a FIR filter, on a single VLSI chip. Accordingly, it is another object of the invention to develop digital shift registers for video applications that can be fabricated together with a FIR filter on a VLSI chip.

SUMMARY OF THE INVENTION

In accordance with my invention, a tapped digital shift register for use as a delay element in conjunction with a FIR filter is implemented using a random-access-memory (RAM). In a first embodiment, the RAM contains x words having yz bits each, where x represents the number of elements in each section of the shift register, y represents the number of taps and z represents the number of bits being stored for each element. Words are continuously read from and written back into the RAM. Before being written back into the RAM, a word is modified by removing a z-bit portion form one end and adding a z-bit portion representing new information to the other end. Intermediate z-bit portions are made available to the taps of the FIR filter. In a second embodiment, the RAM contains two sections to reduce memory cycle time, each section containing x/2 words having yz bits each.

DETAILED DESCRIPTION

Figure 1:
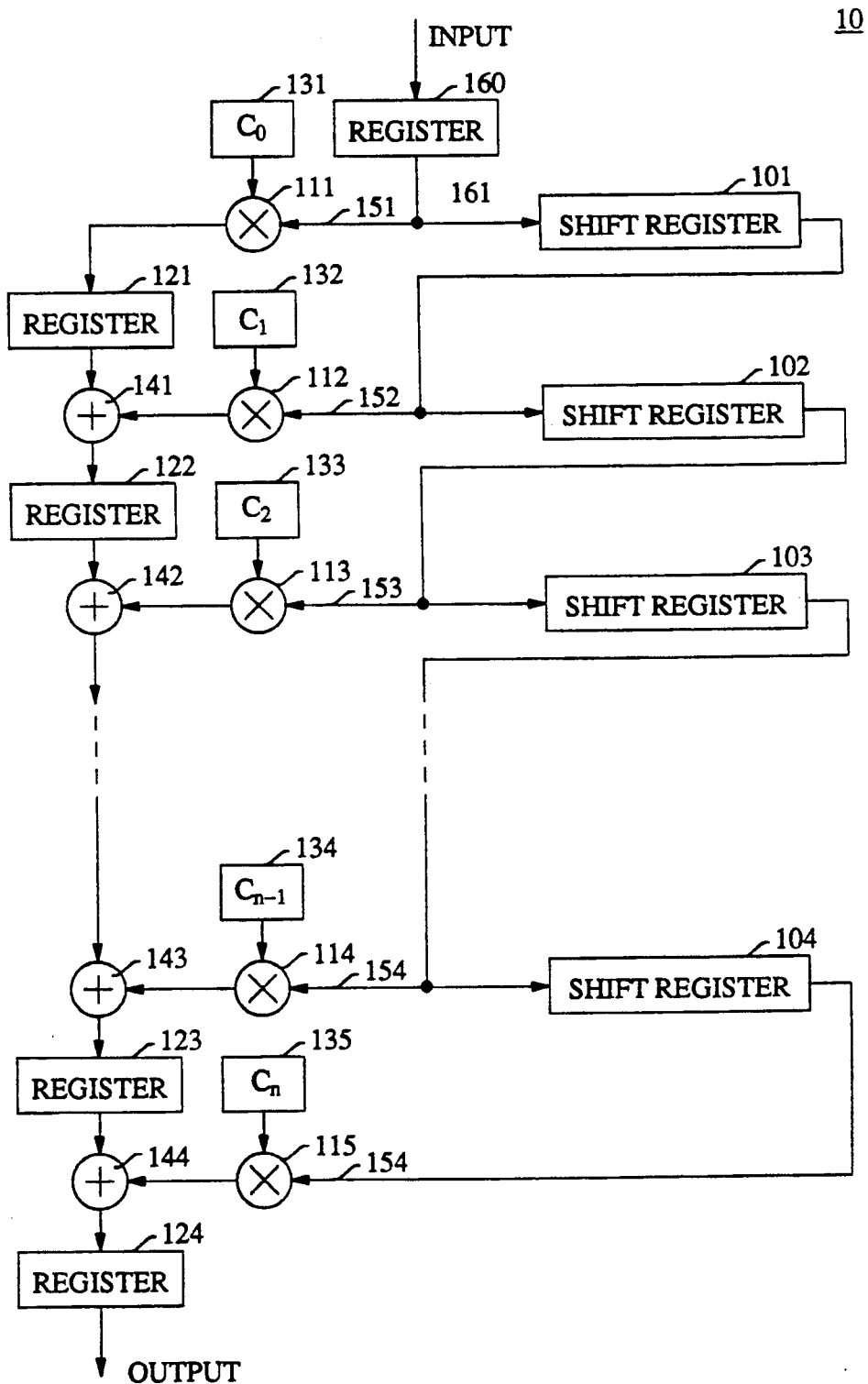
FIG. 1 is a schematic block diagram of a FIR filter with multiple shift registers.

FIG. 1 is a block diagram of an n-tap FIR filter 10 with digital shift registers 101-104 between the taps for use in, for example, a video application. In the first stage of the filter, a digital input signal is applied through register 160 into shift register 101 and multiplier 111. Coefficient register 131 is also connected to multiplier 111. The output of multiplier 111 is applied through register 121 to adder 141. The output of shift register 101 is applied to shift register 102 and multiplier 112 in the second stage of the filter. The interconnections in each stage and between stages are identical. The output of the filter is the output of register 124. A clock circuit (not shown) provides timing signals to each of the elements of the filter and a loading circuit (not shown) can be added to provide means for loading coefficients into registers 131-135. Such clock circuits and loading circuits are well known in the art.

The input signal is a series of digital words, for example, a series of pulse-code-modulation words representing a video signal. The coefficients $C_o$-$C_n$ are set to provide the appropriate filter characteristics and the filtered output appears at register 124. For a video signal, if the number of stages in each shift register 101-104 is equivalent to the number of pixels, or pulse-code-modulation samples, in the portion of the video signal representing one line of the video picture, then, because of the delay caused by shift registers 101-104, the sequence of words presented to adders 111-115 will represent a vertical column of pixels in the picture an the output of the filter will be a number representative of a vertical component in the picture. If shift registers 101-104 are each reduced to one stage, then the sequence of words presented to adders 111-115 will represent a horizontal scan line of pixels in the television picture and the output of the filter will be a number representative of a horizontal frequency component in the picture. A FIR filter with single-stage delay elements is well known in the prior art, for example, as shown in U.S. Pat. No. 4,691,293.

Digital shift registers 101--can be implemented using VLSI technology as is well known in the art. The other elements of FIR filter 10, such as multipliers 111-115, registers 121-124 and 131-135 and adders 141-144 can also be implemented using VLSI technology. To minimize interconnections, it is obviously desirable to fit all of the FIR filter elements and shift registers shown in FIG. 1 on a single VLSI chip. However, for a typical HDTV application using a 16-tap FIR filter, 552 pixels per horizontal scan ling and 9-bit work representing the brightness of each pixel, 16 shift registers would be needed, each having a capacity of 552 9-bit words. Moreover, all the contents of each shift register must be shifted as each 9-bit word is read into the shift registers, which consumes a relatively large amount of power. However, the same function as such shift registers can be provided in less space on a VLSI chip, and with less power consumption, by using one or more RAMs configured accordance with the principles of my invention.

Figure 2:
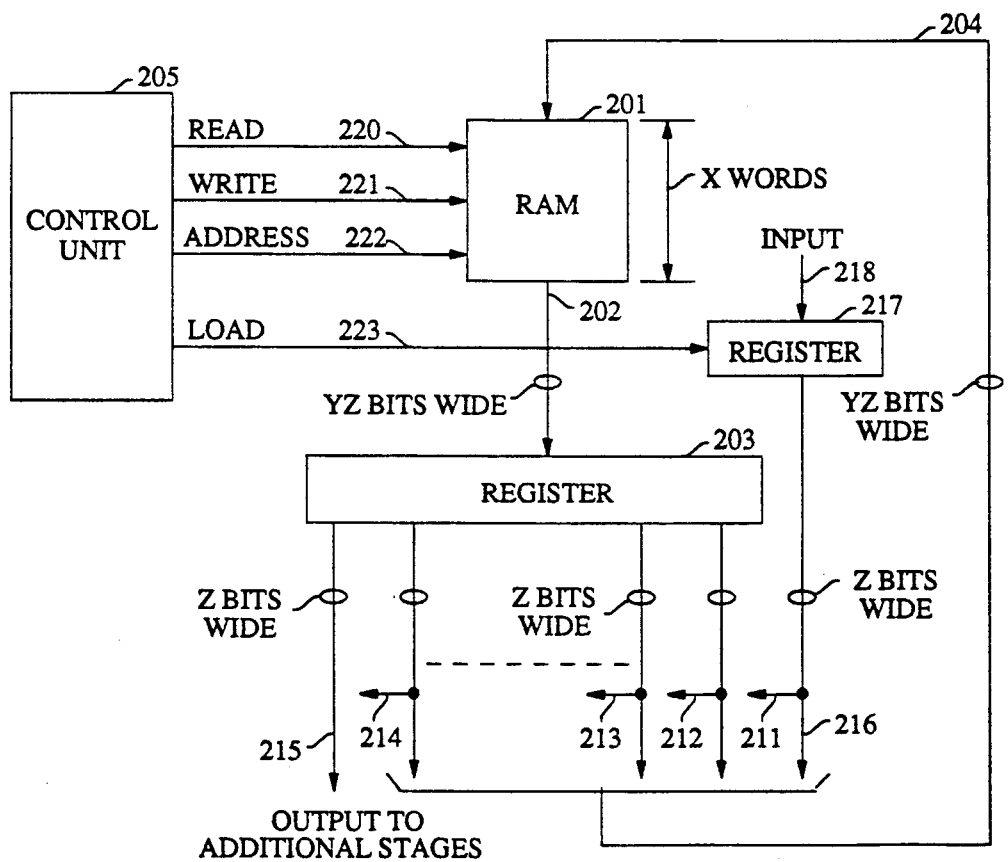
FIG. 2 is a schematic block diagram of a RAM connected to function as a tapped digital shift register in accordance with my invention.

FIG. 2 is a block diagram of a RAM configured as a tapped digital shift register in accordance with my invention. Referring now to FIG. 2, RAM 201 has a capacity of x words of yz bits each. For the typical HDTV application just described, x=552, y=16 and z=9. The output of RAM 201 is applied by lead 202 to register 203 as a parallel word having yz bits. The output word from register 203 is first modified by removing a z-bit portion from one end of the word via lead 215 and appending a z-bit portion to the other end of the word from input register 217. The modified word is applied to the input of RAM 201 by lead 204. Control unit 205 contains an address register and clock circuits to provide read, write and address signals to RAM 201 via leads 220, 221 and 222, respectively, and a load signal to register 217 via lead 224. For use with the FIR filter shown in FIG. 1, outputs are taken from register 203 by means of taps 211-214, such taps correspond to leads 151-153 in FIG. 1. For such use, clock circuits in control unit 205 must be synchronized with the clock circuits (not shown) of the FIR filter.

Figure 3:
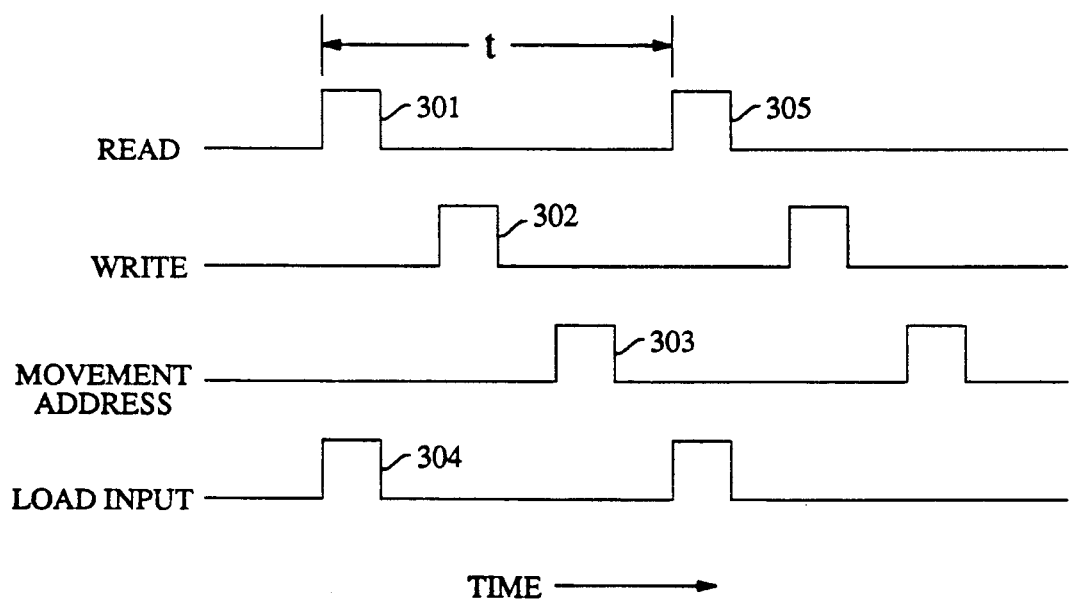
FIG. 3 is a timing diagram for the RAM of FIG. 2.

FIG. 3 is a timing diagram for the RAM shown in FIG. 2. Referring now to both FIG. 2 and FIG. 3, an initial address is assumed to be loaded in the address register in control unit 205. In operation, read pulse 301 causes the contents of the addressed word to be read from RAM 201 and loaded into register 203 via lead 202, erasing the previous contents of register 203. At the same time, pulse 304 causes the next z-bit word to be loaded into register 217, again erasing the previous contents of register 217. Next, write pulse 302 causes the modified version of the word read from RAM 201 to be written back into RAM 201. As described above, such modified word comprises the work read from RAM 201 with a z-bit portion deleted from one end and a second z-bit portion from register 217 appended to the other end. Finally, pulse 303 increments the address register in control unit 205. The cycle then repeats indefinitely. The cycle time t, such as between read pulses 301 and 305, is equivalent to the time between successive input words applied to lead 218 in FIG. 2, and the timing pulses shown in FIG. 3 must be properly synchronized to the application of such input words to lead 218.

During the time between successive read pulses, the contents of registers 203, divided into intermediate z-bit portions, are available via taps 211-214 for use in FIR filter 10 shown in FIG. 1. As previously mentioned, the clock circuits (not shown) driving the various elements of FIR filter 10 must be synchronized with control unit 205.

As can be seen from FIG. 2 and the above description, words applied to register 217 in FIG. 2 appear on taps 211-214 in the same time sequence as words from lead 160 in FIG. 1 appear on leads 151-154. A z-bit word first appearing at tap 212 will reappear at tap 213 after x cycles, at tap 214 after 2x cycles and so on. Thus, RAM 201 acts as a tapped digital shift register that can be used in the same way as individual shift registers 101-104 shown in FIG. 1.

RAM 201 can be a static random access memory (SRAM) or a dynamic random access memory (DRAM) as appropriate. The storage elements in DRAMS are capacitors and eventually such capacitors will become discharged. In applications where information is to be stored in a DRAM for an indefinite time without change, refreshing means must be provided to recharge the storage elements or the stored information will be lost. Such refreshing means are well known in the art. However, if a DRAM is used for RAM 201 in FIG. 2 and the cycle time is short enough, compared to the discharge time of the storage elements, such refreshing means is not required.

Two major advantages of using a RAM instead of conventional shift registers can now be pointed out. Firstly, only a single word of the RAM is read and written during one cycle. In contrast, the entire contents of the shift registers must be shifted during one cycle. Reading and writing one word of the RAM takes considerably less power than shifting all the contents of the shift registers. Secondly, a RAM having a given capacity and its control circuits can be implemented in less area on a VLSI chip than conventional shift registers having the same capacity and their control circuits.

It may be convenient to connect VLSI chips together to form a larger tapped digital shift register than can be implemented on a single chip. Accordingly, the output of register 203 in FIG. 2 can be applied via output lead 215 to input lead 218 of another similar circuit. It may also be convenient to fabricate tapped digital shift registers in which the number of elements of the shift registers is programmable. This can be accomplished with the tapped digital shift register of my invention by providing means to reinitialize the address register in control unit 205 before it reaches its full count. Such means may be an additional register that can be programmed to define the number of addresses to be counted by such address register, and thus the number of shift-register elements. Such additional register and coefficient registers 131-135 shown in FIG. 1 can be registers loaded during an initialization sequence, read-only memories or other means as appropriate.

Figure 4:
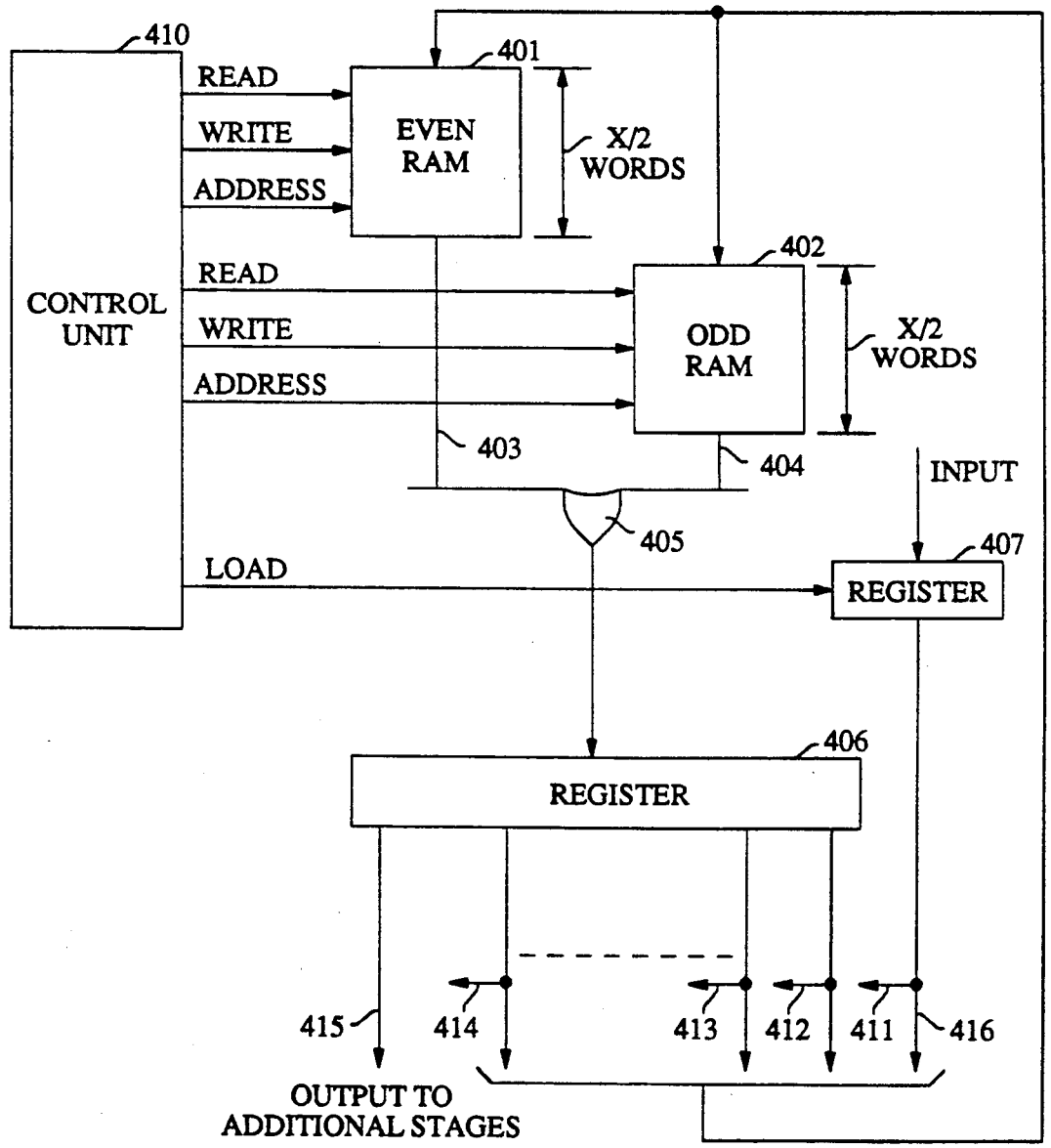
FIG. 4 is a schematic block diagram of a two-section RAM connected to function as a tapped digital shift register in accordance with my invention.

Even though the operation of SRAMS and DRAMS is fast, other digital circuits fabricated using VLSI technology can operate even faster. Thus, an SRAM or DRAM may not be able to keep up with the speed of digital circuits such as those comprising FIR filter 10 in FIG. 1 and efficiency may be lost. Accordingly, in a second embodiment of my invention shown in FIG. 4, I use two separate RAMs alternately to lower the overall read-write time. Referring to FIG. 4, "even" RAM 401 and "off" RAM 402 are connected via leads 403 and 404 through OR gate 405 to register 406. Registers 406 and 407 and their inputs and outputs are similar to registers 203 and 217 and their inputs and outputs in FIG. 2. As shown in FIG. 4, the output from registers 406 and 407, less a z-bit portion from register 406, is connected back to even RAM 401 and odd RAM 402 by lead 408. Control unit 410 contains two address registers, one for even RAM 401 and another for odd RAM 402, plus clock circuits as described for control unit 205 in FIG. 2. For the same overall capacity of x words as RAM 201 in FIG. 2, RAM 401 and RAM 402 in FIG. 4 need a capacity of only x/2 words each. RAM 401 and RAM 402 are read and written alternately, as will now be described.

FIG. 5 is a timing diagram for the configuration shown in FIG. 4. Again, initial addresses are assumed to be loaded in the address registers in control unit 410 for RAMs 401 and 402. Referring to both FIGS. 4 and 5, pulse 501 reads the contents of the addressed word from even RAM 401 and loads such word into register 406 and, at the same time, pulse 502 loads a new z-bit word into input register 407. Such loading erases the previous contents of such registers. Pulse 503 writes the output word of register 406, less a z-bit portion from one end and with the z-bit output from register 407 added to the other end, into the same address in even RAM 401. Pulse 504 increments the address register for even RAM 402. The same sequence is then repeated for odd RAM 402 by pulses 505-508. Note that the time t/2 between successive read pulses 501 and 505 for both RAMs 401 and 402 is half the time t between successive read pulses 501 and 509 for even RAM 401. Thus, assuming equivalent VLSI devices, the overall read/write cycle time of the RAM configuration shown in FIG. 4 can be half that of the RAM configuration shown in FIG. 2. Given the above description, it would be obvious to those skilled in the art how to further divide a RAM to speed up the read/write time even more.

A FIR filter with digital shift registers implemented by an SRAM configured substantially as shown in FIG. 4 has been fabricated on a VLSI chip using 0.9 micron CMOS technology with $x=552$, $y=16$, $z=12$ bits for each coefficient CO–C15 and an accumulation precision of 27 bits. The chip has been tested successfully at a cycle rate of 65 megahertz and consumes about 2 watts at such rate. The total active chip area is 22 square millimeters.

It is understood that other embodiments are possible that incorporate the principles of my invention, and the above disclosure is merely illustrative of such principles and is not intended to be limiting in any respect.

I claim:

1. A shift register for digital words, which comprises:
a random access memory,
means for cycling through the addresses in said memory,
means for reading each addressed word from said memory,
means for modifying each memory word read by removing a portion from one end of said word and appending a portion to the other end of said word, said appended portion being the next digital word to be entered into said shift register, and
mean for writing the output from said 'modifying means into said memory.

2. The shift register of claim 1 in which said means for modifying further comprises:
means for applying at least one intermediate portion of the output from said modifying means to a corresponding output tap.

3. The shift register of claim 1 in which said memory is configured in more than one section and said means for addressing, means for reading and means for writing further comprise means for reading from and writing into said sections sequentially.

4. The shift register of claim 3 in which said memory is configured in two sections and said means for addressing, means for reading and means for writing further comprise means for reading from and writing into said sections alternately.

5. The shift register of claim 1 in which said memory is a static random access memory.

6. The shift register of claim 1 in which said memory is a dynamic random access memory.

7. A shift register for use with a multi-tap finite-impulse-response filter acting on an input stream of digital words, which comprises:
a random access memory,
means for cycling through the addresses in said memory,
means for reading each addressed word from said memory,
means for modifying each memory word read by removing a portion from one end of said word and appending a portion to the other end of said word, said appended portion being the next digital word to be entered into said filter,
means for writing the output word from said modifying means into said memory, and
means for applying portions of the output word from said modifying means to the taps of said filter.

8. The shift register of claim 7 in which said memory is configured in more than one section and said means for addressing, means for reading and means for writing further comprise means for reading from and writing into said sections sequentially.

9. The shift register of claim 8 in which said memory is configured in two sections and said means for addressing, means for reading and means for writing further comprise means for reading from and writing into said sections alternately.

10. The shift register of claim 7 in which said memory is a static random access memory.

11. The shift register of claim 7 in which said memory is a dynamic random access memory.

12. A shift register for use with a finite-impulse-response filter having y taps and an input stream of z-bit digital words representing a horizontally-scanned video signal, each digital word representing a picture element in the picture represented by aid video signal, each horizontal scan line in said picture having x picture elements, said filter being configured to generate signals representing a set of y picture elements aligned vertically in said picture, which comprises:
a random access memory having x addressable words and wherein the number of bits in each word is y X z,
means for cycling through the addresses in said memory
means for reading each addressed word from said memory,
means for modifying each memory word read by removing a z-bit portion form one end of said word and appending a z-bit portion to the other end of said word, said appended portion being the next digital word to be entered into said filter,
means for writing the output word from said modifying means into said memory, and
means for applying y z-bit portions of the output word from said modifying means to the y taps of said filter.

13. The shift register of claim 12 in which said memory is configured in more than one section and said means for addressing, means for reading and means for writing further comprise means for reading from and writing into said sections sequentially.

14. The shift register of claim 13 in which said memory is configured in two sections and said means for addressing, means for reading and means for writing further comprise means for reading from and writing into said sections alternately.

15. The shift register of claim 12 in which said memory is a static random access memory.

16. The shift register of claim 12 in which said memory is a dynamic random access memory.

* * * * *